United States Patent
Kerr et al.

(10) Patent No.: US 7,498,204 B2
(45) Date of Patent: Mar. 3, 2009

(54) STRUCTURE AND METHOD FOR IMPROVED HEAT CONDUCTION FOR SEMICONDUCTOR DEVICES

(75) Inventors: Daniel Charles Kerr, Orlando, FL (US); Alan Sangone Chen, Windermere, FL (US); Edward Paul Martin, Jr., Orlando, FL (US); Amal Ma Hamad, Frisco, TX (US); William A. Russell, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/968,693

(22) Filed: Jan. 3, 2008

(65) Prior Publication Data

US 2008/0102584 A1      May 1, 2008

Related U.S. Application Data

(62) Division of application No. 10/955,238, filed on Sep. 30, 2004, now Pat. No. 7,345,364.

(51) Int. Cl.
*H01L 21/00* (2006.01)
(52) U.S. Cl. .................. 438/122; 257/E21.51
(58) Field of Classification Search .......... 438/122
See application file for complete search history.

(56) References Cited

U.S. PATENT DOCUMENTS

| | | |
|---|---|---|
| 5,229,643 A | 7/1993 | Ohta et al. |
| 5,313,094 A | 5/1994 | Beyer et al. |
| 5,621,616 A | 4/1997 | Owens et al. |
| 5,629,561 A | 5/1997 | Shin et al. |
| 5,955,781 A | 9/1999 | Joshi et al. |
| 6,100,199 A | 8/2000 | Joshi et al. |
| 6,195,256 B1 | 2/2001 | Tiziani et al. |
| 6,803,667 B2 | 10/2004 | Okura et al. |

*Primary Examiner*—David A Zarneke

(57) ABSTRACT

A thermally conductive structure for a semiconductor integrated circuit and a method for making the structure. The structure comprises one or more vertical and/or horizontal thermally conductive elements disposed proximate a device for improving thermal conductivity from the device to a substrate of the integrated circuit. In one embodiment a heat sink is affixed to the integrated circuit for heat flow from the integrated circuit. The method comprises forming openings in material layers overlying the semiconductor substrate, wherein the openings are disposed proximate the device and extend to the substrate. A thermally conductive material is formed in the openings to provide a thermal path from the device to the substrate.

15 Claims, 15 Drawing Sheets

STRUCTURE AND METHOD FOR IMPROVED HEAT CONDUCTION FOR SEMICONDUCTOR DEVICES

RELATED APPLICATIONS

This application is a divisional of U.S. Ser. No. 10/955,238 filed Sep. 30, 2004 now U.S. Pat. No. 7,345,364, which is incorporated herein in its entirety by reference.

FIELD OF THE INVENTION

The present application relates generally to semiconductor integrated circuits and more specifically to thermally conductive structures formed in a semiconductor integrated circuit for removing heat therefrom and to a method for forming the thermally conductive structures.

BACKGROUND OF THE INVENTION

Integrated circuits (chips or die) typically comprise a semiconductor substrate and semiconductor devices, such as transistors and resistors, formed from doped regions within the substrate. Interconnect structures (also referred to as metallization layers), formed in electrically isolated layers overlying the substrate provide electrical connection between doped regions to form electrical circuits in the integrated circuit. To provide physical and environmental protection, most integrated circuits are enclosed in a package having a plurality of externally directed pins or leads through which the integrated circuit is connected to other electrical components. In certain applications, the chip is direct-mounted to a receiving structure, such as a printed circuit board that carriers other electronic components, without the use a package; i.e., a bare die. Other mounting technologies are known to those skilled in the art, including epoxy underfill.

Current flow through the chip devices and the interconnect structures generates heat, raising the internal temperature of the chip and its constituent elements. Whether the chip is packaged or used as a bare die, the heat should be removed from the chip, either through the substrate or the metallization layers, to maintain a chip operating temperature below a predetermined temperature limit.

Excessive chip temperatures can cause temporary or permanent alterations in chip operation. Permanent changes lead to premature chip failure and thus are considered chip reliability failures. Temporary changes affect functional performance during the interval of excessive temperature, but the integrated circuit returns to normal functionality after the temperature falls to its nominal design value.

For chip reliability failures, excessive operational temperatures exponentially decrease chip lifetime. Electromigration and silicon dioxide breakdown, either of which can lead to chip failure, both worsen with increased temperature. At higher temperatures corrosion mechanisms accelerate and increased differential thermal expansion stresses are generated at material interfaces, such as the interfaces between semiconductor materials and metal interconnect structures.

To avoid performance or functional effects resulting from excessive temperatures, an integrated circuit is designed to operate below an upper temperature limit. The actual operating temperature is influenced by ambient temperature, the chip's operating speed, and the supply voltage. Temperatures above the design limit can cause device instability, and regions of differential temperature within the chip can cause mismatched operation of matched components. The reverse bias current in pn junctions, such as the pn junctions of diodes, bipolar junction transistors (BJT's) and metal-oxide semiconductor field effect transistors (MOSFET's) increases with increasing temperature, affecting device performance.

If an element within the chip dissipates a substantial amount of power, occupies a relatively small area, or is on a thermal path that includes a high thermal resistance to the ambient environment, the device may experience a substantial temperature rise. For example, consider a polysilicon resistor for biasing a high-current circuit. Such resistors are typically very small and are formed over an isolation layer comprising silicon dioxide, which presents a relatively high thermal resistance in the thermal path from the resistor to the semiconductor substrate. Thus the temperature rise in a local region proximate the resistor can be very high, reducing the lifetime of the resistor and surrounding components.

To reduce the chip's operating temperature, it is known to use a passive heat sink attached to a bottom surface of the chip to more efficiently transfer heat from the chip to the ambient environment. FIG. 1 illustrates a device package 1 comprising package leads 2. An integrated circuit 4 and a heat sink 5 underlying a bottom surface of the integrated circuit 4, are affixed within a die attach area 6. Bond pads 7 are formed on an upper surface 8 of the integrated circuit 4, and connected to the package leads 2 by bond wires 9.

In another known package structure, referred to as flip-chip or bump bonding, the bond wires 9 of FIG. 1 are replaced with deposited solder bumps 10 formed on the bond pads 7. See FIG. 2. The integrated circuit 4 is connected to a package by flipping the integrated circuit 4 and soldering the bumps 10 to corresponding package receiving pads that are in turn connected to corresponding package leads.

According to both packaging structures described above, heat is withdrawn from the integrated circuit 4 through thermal paths to the heat sink 5. A metal plate, referred to as a copper slug, is one example of such a heat sink. Because the semiconductor substrate is a better thermal conductor than most other materials within the chip (with the exception of the electrically conductive interconnect structures), it is preferred to direct heat through the substrate to the heat sink 5. The thermal conductivity of materials comprising the chip varies widely. The thermal conductivity of copper is about 4.0 W/cm-° K., silicon is about 1.5 W/cm-° K. and silicon dioxide is about 0.01 W/cm-° K. It is also possible, but not necessarily desirable, to direct heat through silicon dioxide regions within the chip. Prior to attaching the heat sink 5 to the integrated circuit 4, a back-grinding process thins a bottom surface of the semiconductor substrate to increase thermal conductivity to the heat sink 5 by shortening the thermal path through the substrate.

When packaged in the package 1 of FIG. 1, heat flows from the heat sink 5 into the package 1, which may further include a package heat sink (not shown) to improve heat dissipation from the package to the ambient environment. To further improve heat dissipation, a cooling fan mounted proximate the package directs ambient air across the package heat sink.

It is also possible to conduct heat through the chip to a top surface of the integrated circuit 4. However, this is generally not the preferred primary heat removal path due to the presence of the bond pads 7 and electrical conductive connections to the bond pads 7 that may interfere with and reduce the effectiveness of a heat sink mounted to the top surface. However, the chip's top surface can serve as a secondary heat sink. Some heat generated by power-dissipating elements within the chip flows upwardly through the chip interconnect structures and away from the chip through the bond wires 9 or the solder bumps 10.

Both the capacity of the heat removal mechanism and the operational effects of high device operating temperatures must be considered during chip design. However, design tools for evaluating thermal constraints are not widely available and are poorly integrated into the chip design process. If it is determined that the ratio of power density to thermal conductivity in a chip is above a predetermined threshold, to avoid potential thermal problems the chip must be redesigned to lower the power density or increase the thermal conductivity. One known technique for increasing thermal conductivity lowers the thermal resistance between the heat dissipating components and a surface of the semiconductor substrate, where a heat sink can be disposed if desired. The back-grinding process described above is such a technique.

Although it is axiomatic that thermal conductivity improvements must not degrade device performance, certain prior art attempts to improve heat flow to the heat sink have unfortunately constrained device design. For example, high-power dissipation circuit elements should not be surrounded by a high-thermal resistance material. Thus polysilicon resistors disposed overlying silicon dioxide are avoided and substrate resistors (i.e., resistors formed from doped regions in the semiconductor substrate) are employed instead. Although improving thermal conductivity for resistor-generated heat, this technique reduces design flexibility. Since the semiconductor substrate has a higher thermal conductivity than silicon dioxide, heat generated by a substrate resistor flows through a higher thermal conductivity path to a chip surface. However, substrate resistors have far higher parasitic leakage and capacitance than a polysilicon resistor formed in a silicon dioxide layer. The resistance of the substrate resistor also exhibits a greater dependency on the applied voltage than a polysilicon resistor, and may generate more noise.

If the power dissipation of a chip exceeds design limits, it may be necessary to redesign the chip, such as by increasing device area. Although increasing the device area reduces power dissipation in a volume of chip material, the chip area and costs are increased. A larger device area can also increase parasitic capacitance and device power consumption. Another device design strategy reduces power dissipation by altering one or more performance specification of the integrated circuit, e.g., reducing the device's operating voltage or operating speed. Although this may be acceptable for certain device applications, generally product manufacturers demand higher speed integrated circuits.

As development of VLSI and ULSI (very large scale and ultra large scale) integrated circuits continues, device size shrinks, device density increases and digital device clock speed increases. These technology advances exacerbate concerns over excessive operating temperatures within the integrated circuit due to marginal or inadequate heat removal mechanisms.

BRIEF SUMMARY OF THE INVENTION

According to one embodiment, the present invention comprises a semiconductor integrated circuit further comprising a first region having a first thermal conductivity and a second region having a second thermal conductivity less than the first thermal conductivity. A device is disposed in the second region and a thermally conductive structure is disposed proximate the device and extends to the first region. Heat generated by the device is conducted through the conductive structure to the first region; the thermally conductive structure is not an electrical current path.

According to another embodiment, the present invention comprises a method for forming a semiconductor integrated circuit comprising forming doped regions in a semiconductor substrate and forming material layers overlying the substrate. A device is formed in one or more of the material layers and openings are formed in the material layers, wherein the openings extend to the substrate and are disposed proximate the device. Thermally conductive material is formed in the openings.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Before describing in detail the particular structures and methods for providing improved heat conduction from devices within an integrated circuit according to the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The present invention teaches structures and processes for conducting heat, but not electrical current, within an integrated circuit. According to a preferred embodiment, a material of the structure comprises metals or other materials having a relatively high thermal conductivity that are used in conventional fabrication processes for electrical interconnect structures, contacts and conductive windows within the integrated circuit. Use of such materials is advantageous as the processes and hardware for incorporating such materials into the integrated circuit are known and in use.

The invention teaches thermally conductive structures (and methods for forming same) for drawing heat from a heat-generating device, with or without making electrical and/or thermal contact to the device, and for conducting the heat through the chip. In one application, the heat sink disposed on a chip surface conducts the heat away from the chip. In those embodiments of the invention where the thermally conductive structures are not in electrical contact with the heat-generating device, (or other electrically conductive structures in the integrated circuit) the structures can be terminated in contact with the semiconductor substrate or another electrically conductive heat sink. For those embodiments where the thermally conductive structures are in electrical contact with the heat-generating device the structures must be terminated in an insulating material to avoid current flow through the thermally conductive structure. Thus, the thermally conductive structures can be electrically connected to the heat-generating device or electrically connected to the heat sink, but the thermally conductive structures cannot be electrically connected to both. In another embodiment, the thermally conductive structures are electrically connected to neither the heat generating device nor the conductive heat sink.

The present invention also teaches contact structures (and methods for making same) for connecting the thermally conductive structure to a heat sink, with and without making an electrical contact to the heat sink.

Figure 1:
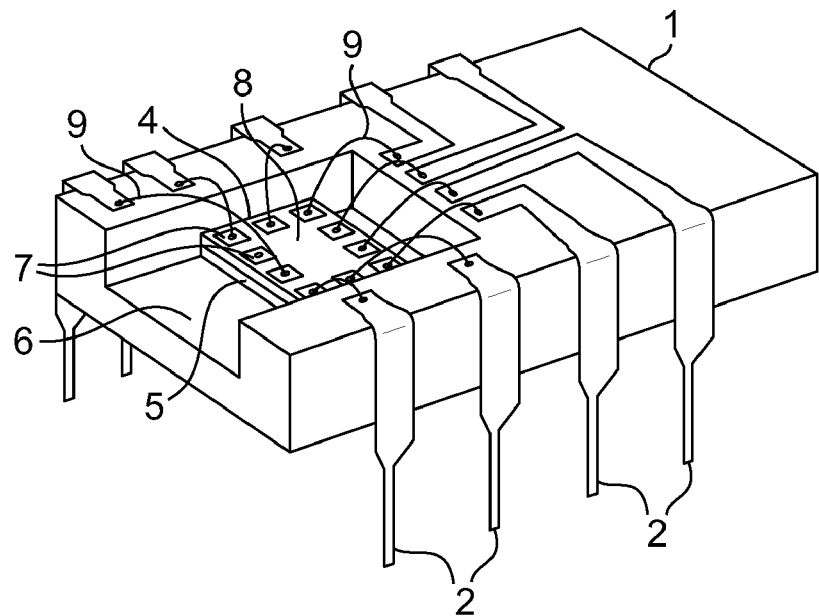
FIGS. 1 and 2 are perspective illustrations of prior art integrated circuit packaging structures.
Figure 2:
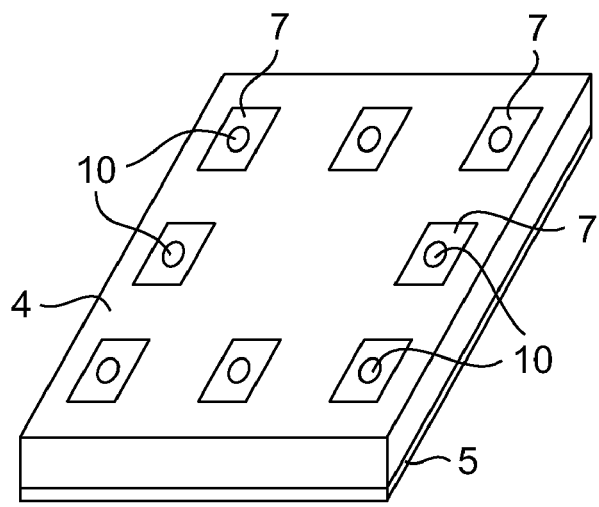
Figure 3:
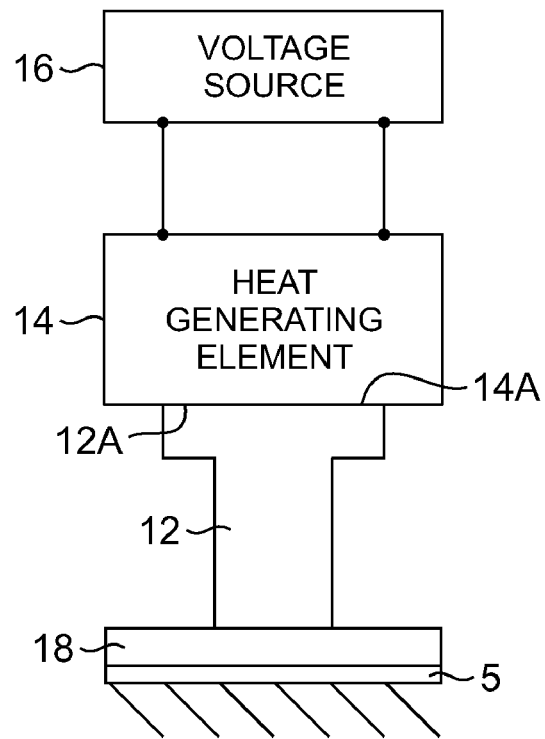
FIG. 3 is a block diagram illustration of a heat conduction structure of the present invention.

FIG. 3 generically illustrates a thermally conductive structure 12 having a surface 12A in thermal contact with a surface 14A of a heat-generating device 14 within an integrated circuit. In response to a voltage source 16, the device 14 generates heat during operation. The thermally conductive structure 12 causes the heat to flow to a heat sink 18 of the integrated circuit, which may be in thermal communication with an externally disposed heat sink, such as the heat sink 5, to further aid in removing heat from the integrated circuit. The surface 12A of the thermally conductive structure 12 can be in both thermal and electrical contact with the device 14. Alternatively, the surface 18 can be in both thermal and electrical contact with the heat sink 18, but electrical contact by both surfaces is not permitted as such a configuration would cause electrical current to flow through the thermally conductive structure 12.

The thermally conductive structures of the present invention include, but are not limited to, bars, rods and solid surfaces spaced laterally apart from or in thermal or electrical contact with the heat-generating device. In one embodiment, the thermally conductive structure further comprises a lid in thermally conductive communication with the device and/or with the structures. Thermal contact between the thermally conductive structures and the device can be effected at one or both end surface regions of the device or at a surface region intermediate the end regions. In another embodiment, the lid is spaced apart from the device and the thermally conductive structures.

The invention further teaches structures for making either electrical or non-electrical contact to the heat sink 18, (i.e., electrically insulated from but in thermal communication with the heat sink in the latter case), while providing a thermally conductive path for heat flow into the heat sink 18.

Figure 4:
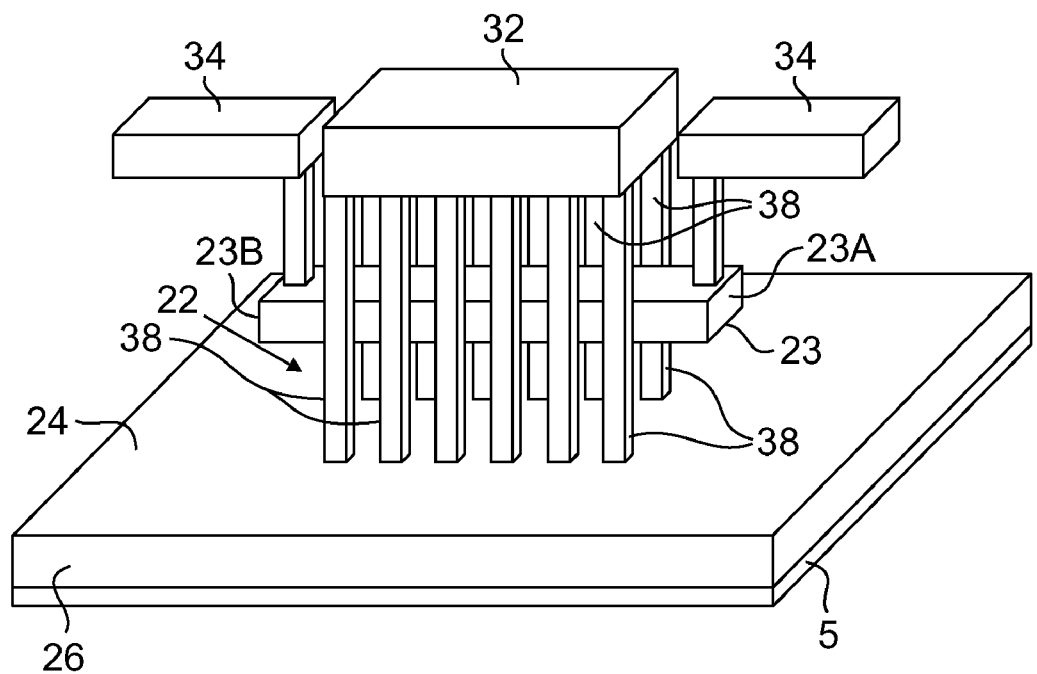
FIG. 4 is a perspective illustration of a thermally conductive structure constructed according to the teachings of the present invention.
Figure 5:
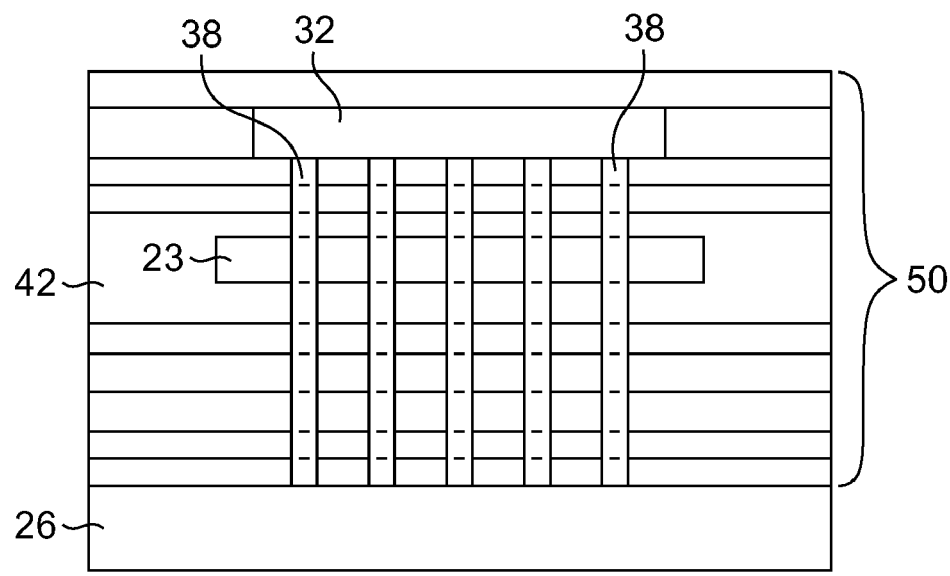
FIG. 5 is an elevation illustration of the thermally conductive structure of FIG. 4, illustrating the thermally conductive structure formed in material layers of the integrated circuit.
Figure 6:
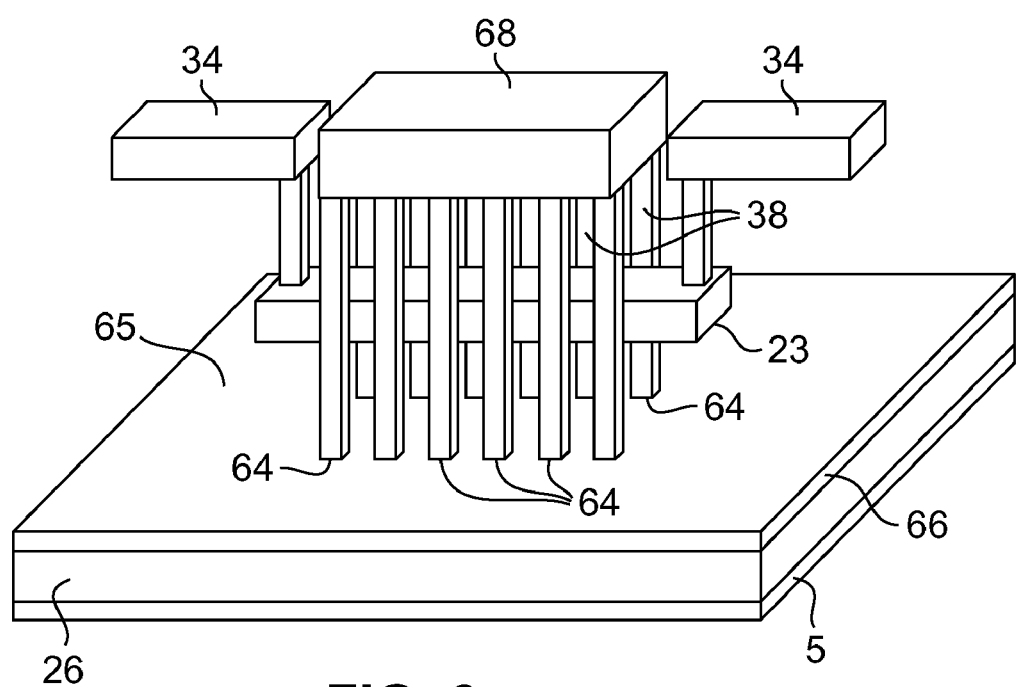
FIGS. 6-14 are perspective illustrations of thermally conductive structures constructed according to various embodiments of the present invention.

Several embodiments of the present invention comprising thermally conductive structures are illustrated in FIGS. 4, 5 and 6. An embodiment of FIG. 4 illustrates a thermally conductive "cage" structure 22 disposed about a resistor 23 formed above a surface 24 of a heat sink 26, e.g., a semiconductor substrate of the integrated circuit. The resistor 23 may be formed in a silicon dioxide layer and is therefore surrounded by silicon dioxide material. A top plate or lid 32 of the cage 22 is electrically isolated from electrical conductors 34 conductively connected to end regions 23A and 23B of the resistor 23. In one embodiment, the lid 32 is formed in the same conductive layer and during the same process steps as the electrical conductors 34.

The cage 22 further comprises a plurality of thermally conductive bars 38 terminating on or proximate the surface 24 to improve thermal conductivity from the heat-generating resistor 23 to the heat sink 26, as the thermally conductive bars 38 have a higher thermal conductivity than the silicon dioxide surrounding the resistor 23. Heat dissipated by the resistor 23 flows through the silicon dioxide material to the lid 32 and the bars 38, then down the bars 38 to the heat sink 26. In one embodiment, the external heat sink 5 is disposed on the heat sink 26 to further aid removal of heat from the integrated circuit.

Improved heat flow from the resistor 23 to the heat sink 26, according to the teachings of the present invention lowers the resistor temperature, reducing the debilitating effects of high temperatures on the resistor and other components of the integrated circuit. Thus chip reliability is increased and the operational effects of an excessive operating temperature are reduced.

Although FIG. 4 illustrates the bars 38 in a substantially vertical orientation, this feature is not necessarily required according to the teachings of the present invention, as bars forming an angle of other than 90 degrees with the surface 24 can be employed to draw heat from the resistor 23. The number and length of the bars 38 is selected dependent on the heat dissipated by the resistor 23 and the thermal specification of the integrated circuit. However, the number and length may be constrained by design rules of the process employed to fabricate structures within the integrated circuit. According to a preferred embodiment, a maximum number of minimally spaced bars 38 is used to draw a maximal amount of heat from the resistor 23. A material of the bars 38 preferably comprises a thermally conductive material that is employed during other integrated circuit fabrication steps, such as a material employed to form contacts or interconnect structures, e.g., tungsten, copper and aluminum. Those skilled in the art recognize that other materials having an appropriate thermal conductivity can be used, if the material is compatible with the fabrication process. Although the bars 38 are illustrated as having a rectangular cross-section, this is not necessarily required according to the teachings of the present invention. Bars 38 of various shapes and lengths may be employed as permitted by the fabrication process design rules.

The resistor 23 is merely an exemplary application for the teachings of the present invention. In other embodiments the thermally conductive structure 22 can be used in conjunction with other devices formed in a silicon dioxide layer overlying the substrate, e.g., a diode, a light emitting diode or a polysilicon bipolar junction transistor. Additionally, the teachings of the present invention are not limited to heat dissipating devices formed in silicon dioxide, and can be applied to devices formed in any electrical insulating material, especially those materials having a relatively poor thermal conductivity, e.g., air, vacuum, certain liquids, silicon nitride, various low dielectric constant materials (that are not silicon-based) and layered stacks of such materials.

In an embodiment illustrated by an elevation view of FIG. 5, the thermally conductive bars 38 are formed within vertical openings (e.g., vias or windows) defined in material layers 4 between the resistor 23 and the heat sink 26. The material layers 4 represent dielectric material layers and conductive interconnect layers of the integrated circuit. In an embodiment where the thermally conductive bars 38 are formed from electrically conductive material and the material layers 4 comprise one or more conductive material layers, the bars 38 must be electrically insulated from the conductive material layers.

In another embodiment (not illustrated), the bars 38 are formed in the material layers 4 above the resistor 23. In still another embodiment (not illustrated), the bars 38 are formed in the material layers 4 both above and below the resistor 23.

FIG. 6 illustrates the thermally conductive bars 38 each having a lower end 64 that has no electrical contact to the heat sink 26, i.e., the semiconductor substrate, but instead terminates on a surface 65 of an insulating material layer 66 overlying the semiconductor substrate. In another embodiment, the insulating material layer 66 is absent, but the individual bars 38 are terminated with an insulating material to prevent electrical contact to the electrically conductive heat sink 26.

In the FIG. 6 embodiment, electrical insulation of the bars 38 is required because the bars 38 are in electrical communication with one of the electrical conductors 34 via a lid 68. There is no current flow through the bars 38 because they do not form a complete electrical circuit, i.e., the bars 38 are open-circuit or stub structures terminated in an insulating material. However, a thermal conductive path is provided from the bars 38 through the insulation material layer 66 and the heat sink 26 to the external heat sink 5. In another embodiment (not illustrated) the bars 38 are in electrical communication with both of the electrical conductors 34, but again there is no current flow due to the absence of a complete electrical path.

The FIG. 6 embodiment may provide a more efficient heat transfer path in certain applications, permitting the resistor 23 to operate at a lower temperature than the embodiment of FIG. 4.

As can be appreciated by those skilled in the art there are many possible variants of the thermally conductive structures of the present invention, e.g., variations related to shape, material composition and location. Selection of the characteristics of the thermally conductive structures is dependent on the fabrication technologies (e.g., process steps, materials) employed to fabricate the integrated circuit into which the structures are incorporated.

Figure 7:
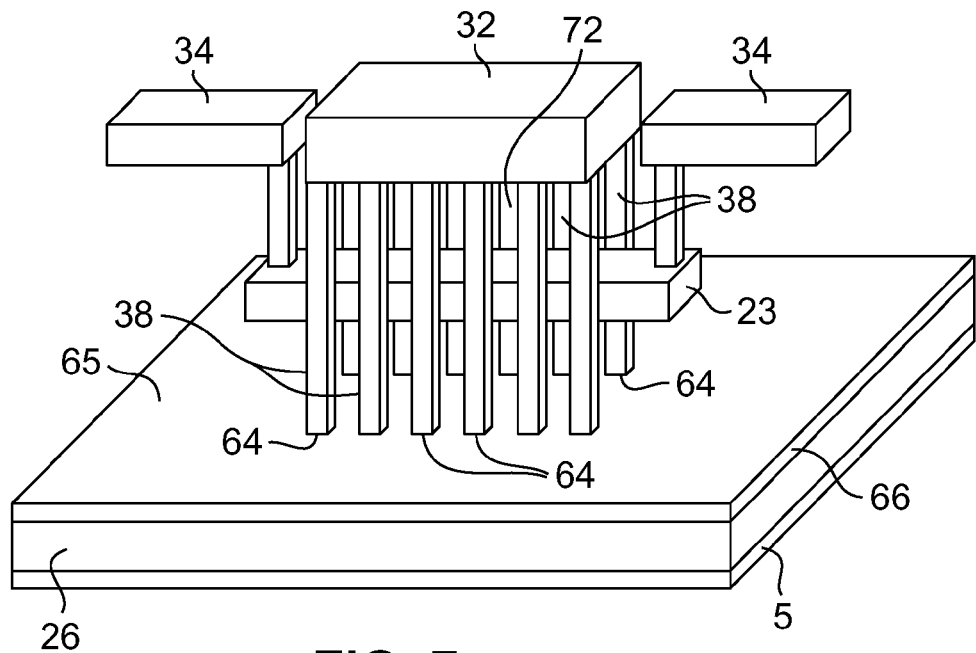

FIG. 7 illustrates an embodiment of the present invention having a thermally conductive element 72 disposed between and in contact with a region of the resistor 23 (intermediate the end regions 23A and 23B) and the top plate 32. This embodiment offers additional thermal design flexibility by providing another structure for removing heat from the resistor 32 through direct physical contact. However, since the bars 38 are in electric contact with the resistor 23 via the conductive element 72, the bars 38 must be insulated from the heat sink 26 to avoid current flow through the bars.

Figure 8:
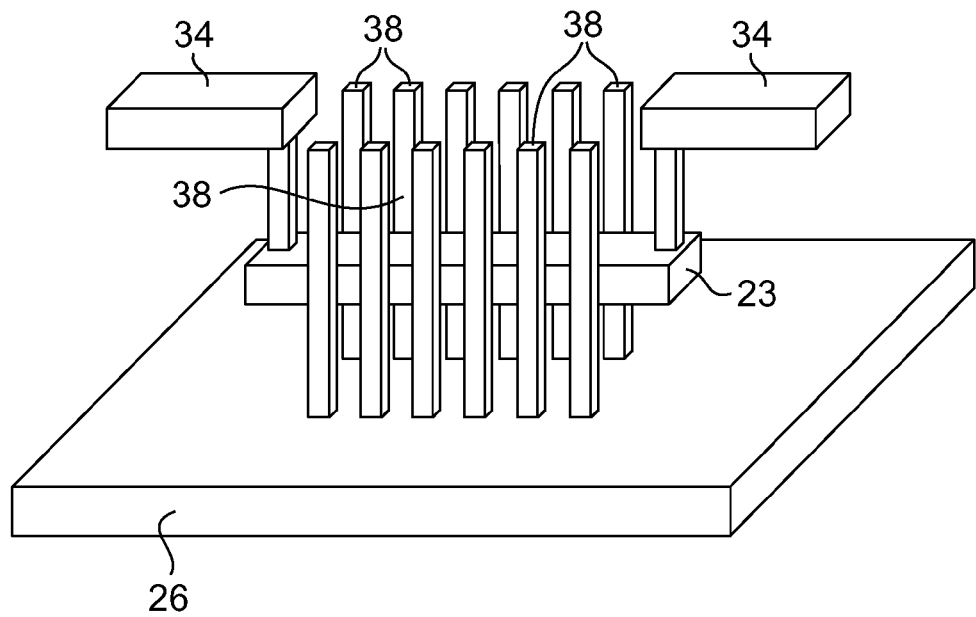

In a FIG. 8 embodiment, the top plate 32 is absent to permit formation of electrical interconnect structures (other than the electrical conductors 34) over the resistor 23. In another embodiment, not illustrated, the thermally conductive bars 38 do not extend upwardly to a plane of the electrical conductors 34.

The thermally conductive bars 38 can be formed by known fabrication technologies, such as the processes steps used to form tungsten contacts for doped regions of the integrated circuit. Since tungsten contacts formed according to conventional processing are of the same size and have a rectangular cross-section, the bars 38 are illustrated with those features. However, bars of various size and cross-section are considered within the scope of the present invention and can be realized by fabrication process technologies that can accommodate such characteristics.

Figure 9:
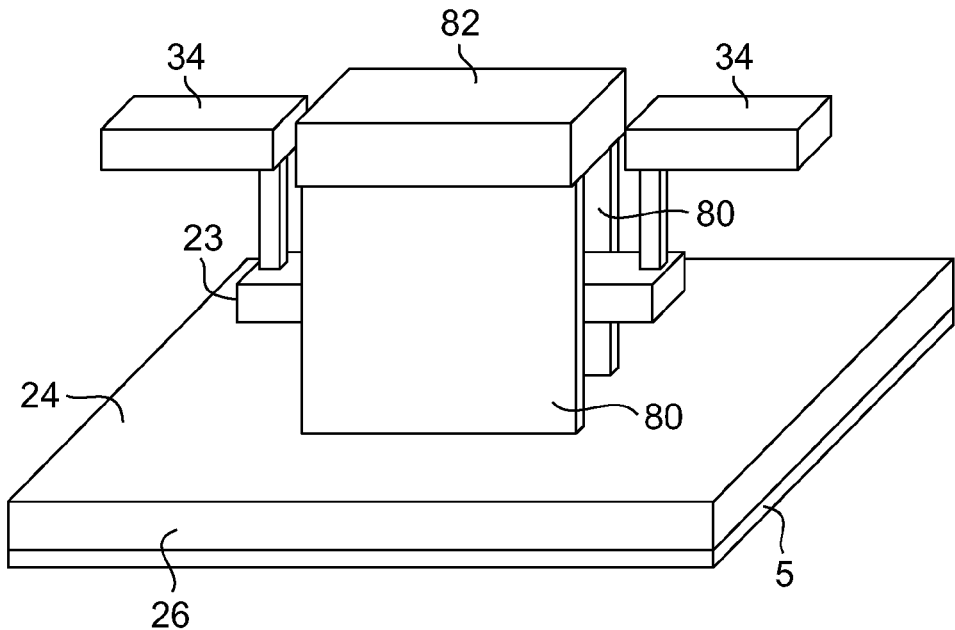

An embodiment of FIG. 9 comprises a thermally conductive structure (e.g., a solid bar or surface) 80 extending a length of the resistor 23 and disposed laterally adjacent one or both sides of the resistor 23, and a lid or top plate 82. The structure 80 can be formed by first forming a trench in the material layers overlying the substrate 16 and filling the trench with a thermally conductive material. The thermally conductive structure can also be formed according to other fabrication process technologies that are known in the art. The structure 80 comprises more mass than the bars 38 and can therefore direct more heat to the heat sink 26. Although illustrated in FIG. 9 as comprising rectangular faces, the structure 4 can be formed with faces in a shape of a polygon.

Figure 10:
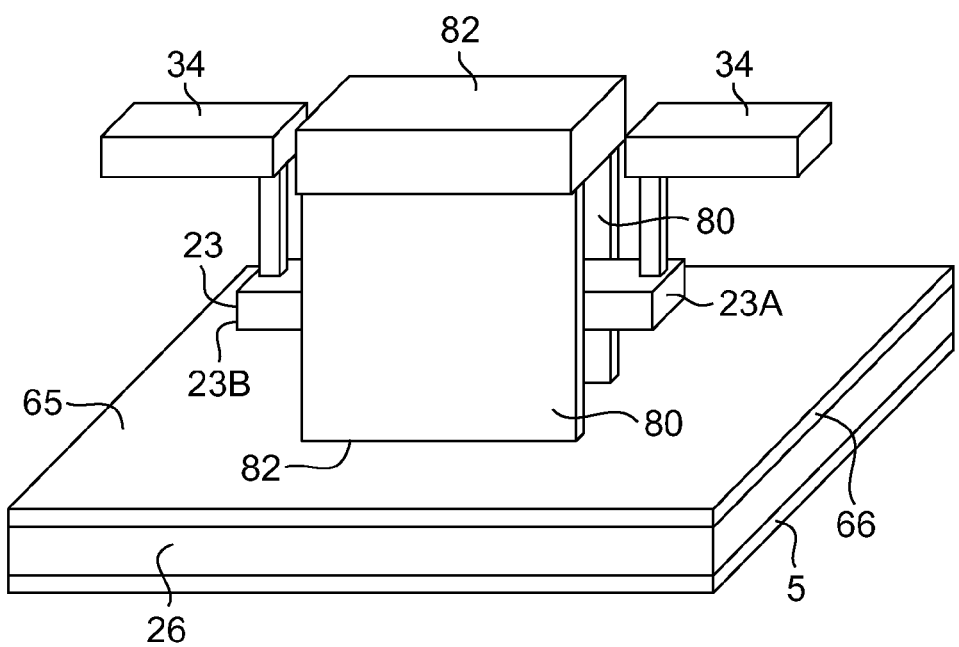

FIG. 10 illustrates the thermally conductive structures 80 each having a lower end 82 that has no electrical contact to the heat sink 26, i.e., the semiconductor substrate, but instead terminates on the surface 65 of the insulating material layer 66. The structures 80 are in electrical communication with one of the electrical conductors 34 via the lid 82, but there is no current flow through the structures 80 because they do not form a complete electrical circuit. However, a thermal conductive path is provided from the resistor 23, through the silicon dioxide surrounding the resistor 23 and the electrical conductors 34, the lid 82, the structures 80, the insulation material layer 66, the heat sink 26 and the external heat sink 5. In another embodiment (not illustrated) the structures 80 are in electrical communication with both the electrical conductors 34.

Figure 11:
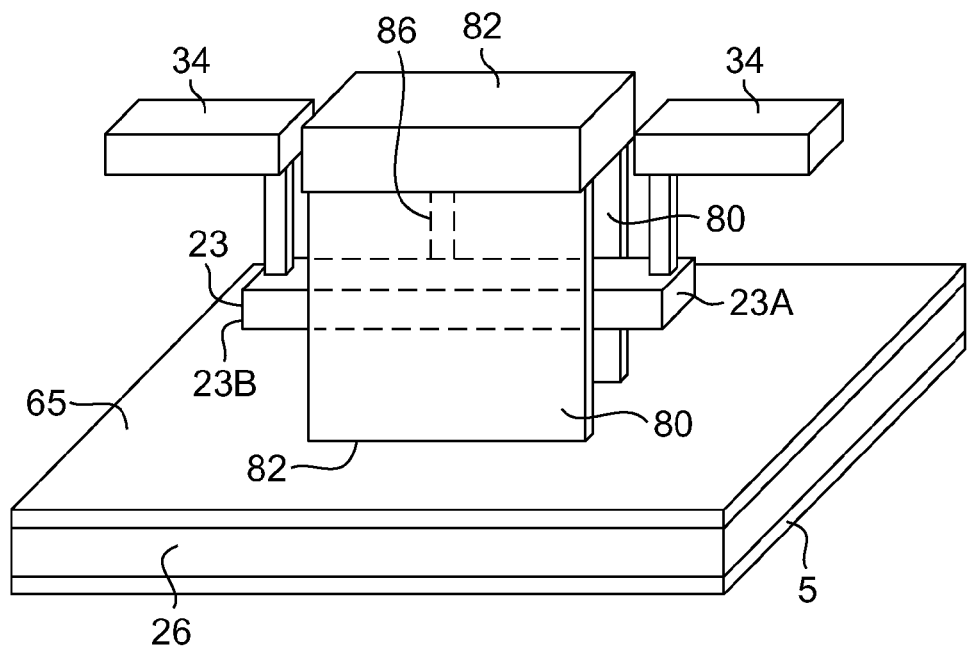

An embodiment of FIG. 11 further comprises a conductive element 86 in contact with the resistor 23 (between the end regions 23A and 23B) and the lid 82. It is necessary to insulate the thermally conductive structures 80 from the heat sink 26 to avoid current flow through the structures 80.

Figure 12:
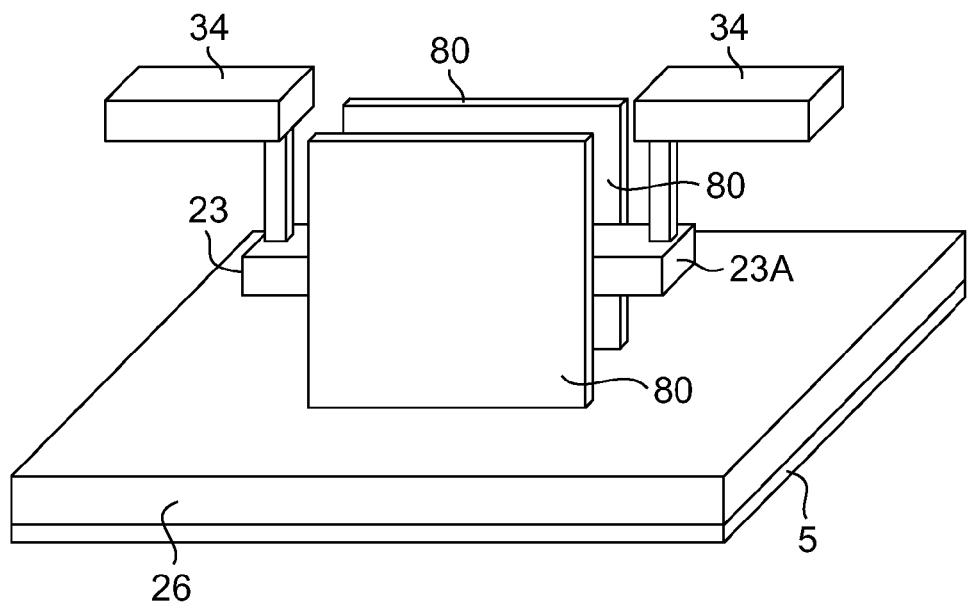

FIG. 12 illustrates an embodiment comprising the structures 80 without the lid 82.

For those embodiments in which the thermally conductive structures are not electrically connected to the heat generating device (such as the resistor 23), the thermally conductive structures can be formed by conventional processes used to form electrically conductive structures, e.g., conductive vias for connecting to doped regions or for connecting alternating horizontal interconnect layers. Such embodiments suitable for conventional formation of the thermally conductive structures are represented by FIGS. 4-6, 8, 9 and 12.

For those embodiments of the present invention in which the thermally conductive structure is in electrical contact with the heat-generating device at a first contact, it is necessary to insulate a second contact from any structure that is capable of carrying electrical current. Thus the present invention teaches thermally conductive structures (and methods for forming same) terminated on an insulative material such that an incomplete (i.e., not forming a closed electrical circuit) electrical contact is formed. Such contacts are thermally conductive to draw heat to or proximate an electrically conductive heat sink, such as the semiconductor substrate, without making electrical contact with the substrate due to an intervening insulating barrier. Heat can flow through the barrier to the substrate, but the electrical circuit is incomplete. Such termination techniques can be used, for example, in conjunction with the embodiments described in FIGS. 6, 7, 10 and 11 where an electrically incomplete circuit is required. Although the other presented embodiments do not require termination of the thermally conductive bars 38 or the structures 80 on an insulating surface, since the bars 38 and the structures 80 are not electrically connected to the heat-generating device, the below described electrically insulated structures and methods can be also used in such embodiments.

Figure 13:
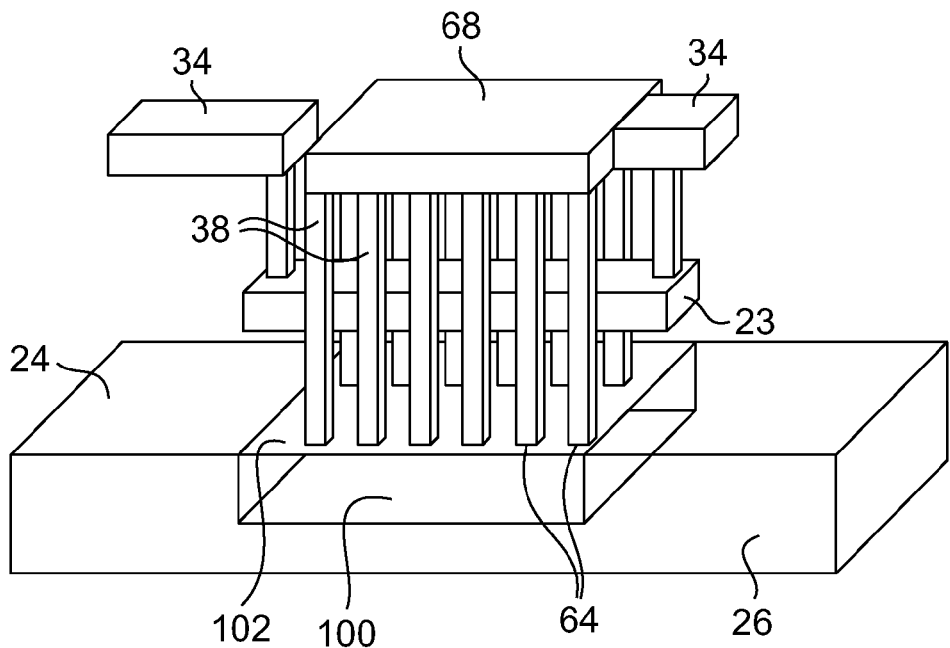

One technique for insulatingly terminating the thermally conductive bars 38 and the structures 80 employs a shallow trench isolation structure 100 as illustrated in FIG. 13. Electrical insulation of the bars 38 is required because the bars are in electrical communication with one of the electrical conductors 34 via the lid 68. There is no current flow through the bars 38 because they do not form a complete electrical circuit.

As described in detail below, openings for receiving thermally conductive material terminate on an upper surface 102 of the shallow trench structure 100. The thermally conductive bars 38 are formed within the openings and do not electrically contact the heat sink 26, i.e., the semiconductor substrate, although heat flow through the bars 38 is directed to the heat sink 26 through the shallow trench structure 100.

Figure 14:
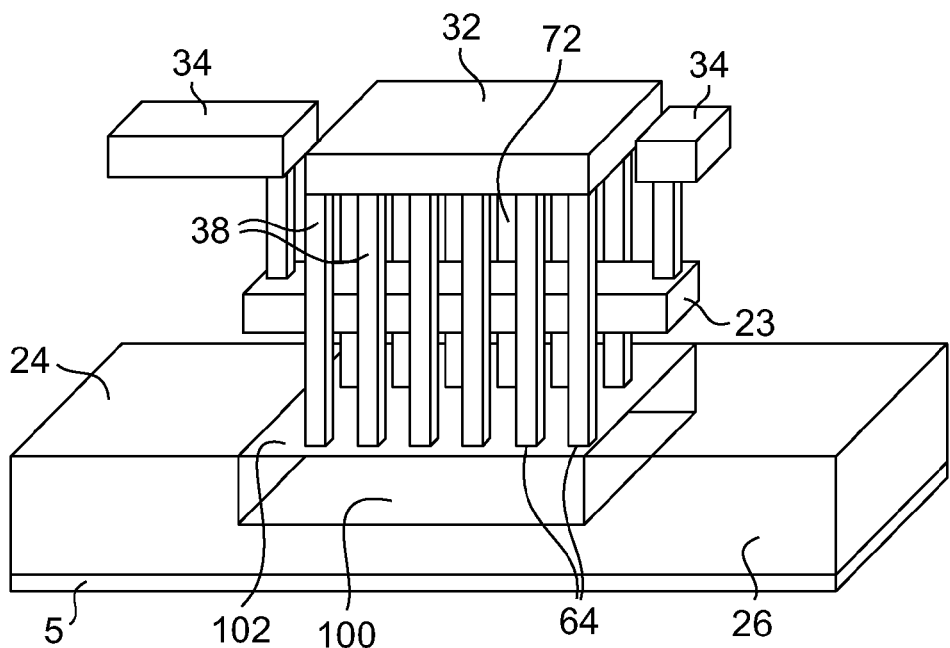

FIG. 14 also illustrates the shallow trench structure 100 useful in conjunction with the thermally conductive element 72 in electrical contact with the resistor 23 to electrically isolate the bars 38 from the heat sink 26, e.g., the semiconductor substrate.

The shallow trench structure 100 can also be used with the thermally conductive structure 80 and the various embodiments thereof.

Figure 15:
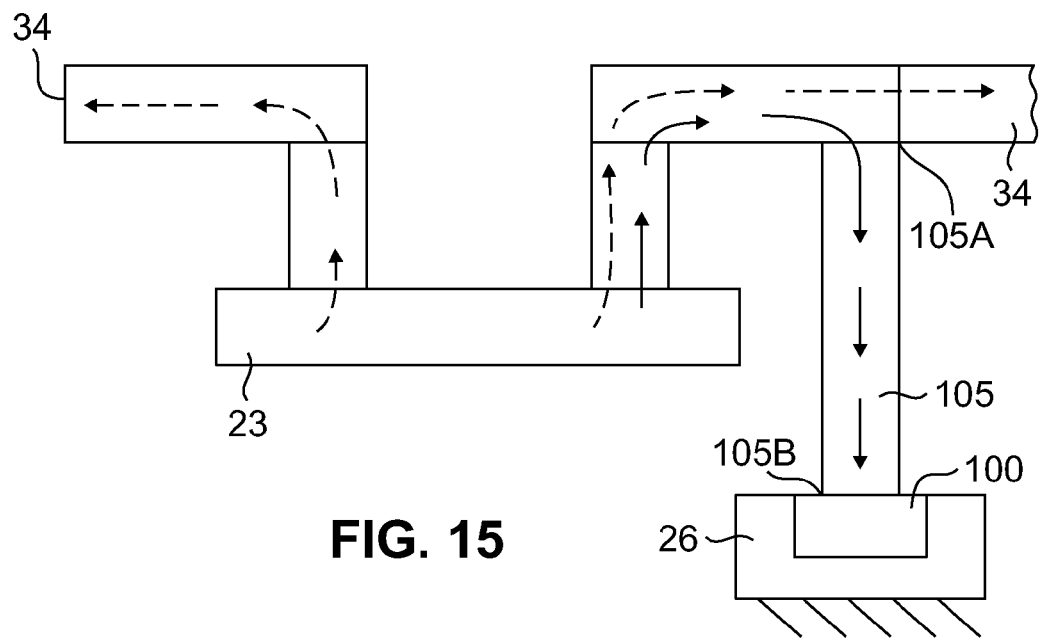
FIG. 15 is a thermal and electrical schematic flow diagram according to one embodiment of the present invention.

FIG. 15 is a schematic diagram of an embodiment of the present invention including a thermally conductive structure 105 having an end 105A thermally and electrically connected to the resistor 23 via the electrical conductor 34, and an end 105B terminating in an electrical open circuit at the shallow trench structure 100 for providing a thermal path to the heat sink 26.

Figure 16:
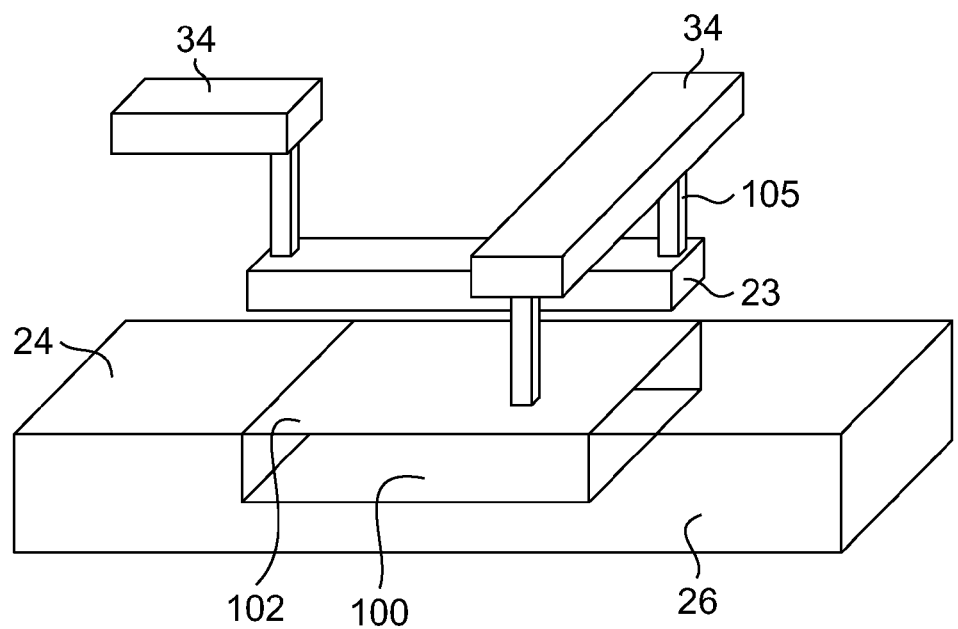
FIG. 16 is a perspective illustration of a thermally conductive structure implementing the schematic diagram of FIG. 15.

FIG. 16 is a perspective view of one implementation of the FIG. 15 schematic representation.

Figure 17:
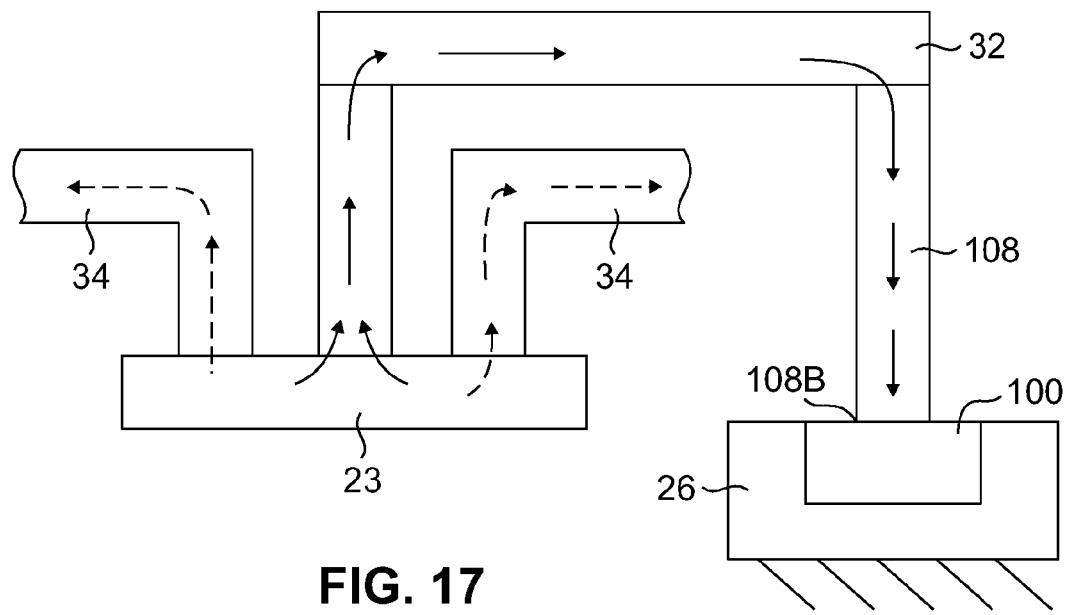
FIG. 17 is an electrical and thermal schematic flow diagram according to another embodiment of the present invention.

FIG. 17 is a schematic diagram of another embodiment of the present invention including a thermally conductive structure 108 having an end 108A thermally connected to the resistor 23 and an end 105B terminating in an electrical open circuit at the shallow trench structure 100 for providing a thermal path to the heat sink 26.

Figure 18:
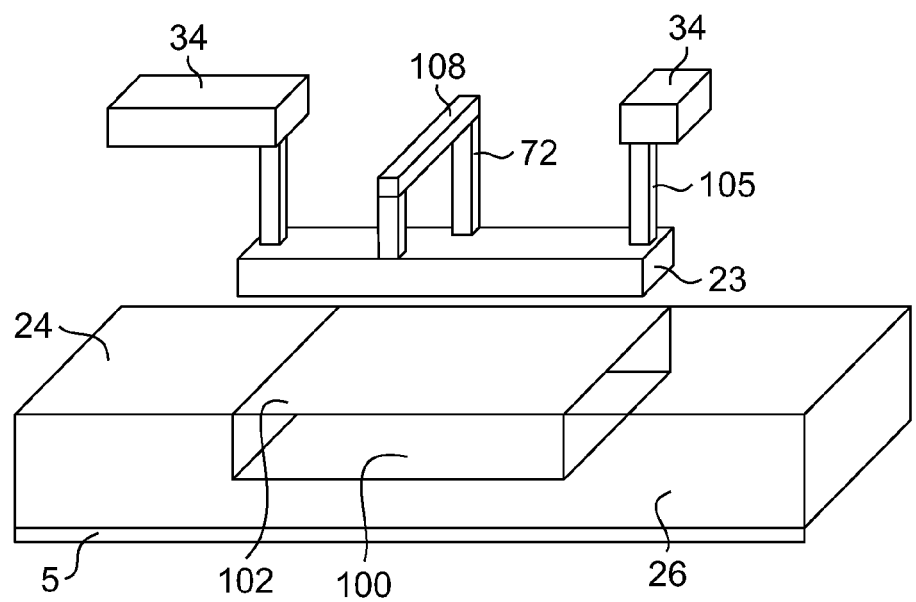
FIG. 18 is a perspective illustration of a thermally conductive structure implementing the schematic diagram of FIG. 17.

FIG. 18 is a perspective view of one implementation of the FIG. 17 schematic representation. The use of the external heat sink 5 in this embodiment is optional.

Figure 19:
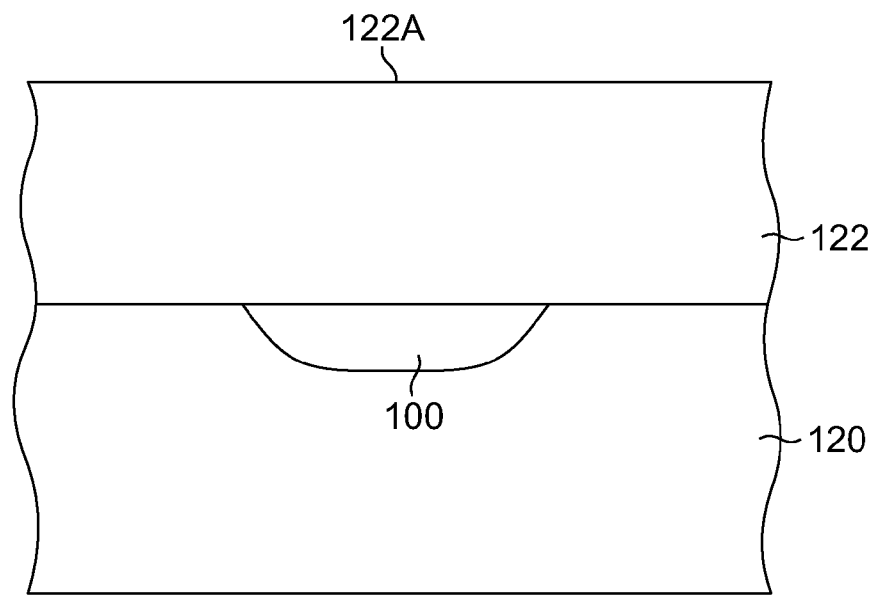
FIGS. 19-23 illustrate sequential process steps for forming a thermally conductive structure according to one embodiment of the present invention.

A process for forming an insulating termination to the shallow trench structure 100 is illustrated beginning in FIG. 19 where the shallow trench structure 100 has been formed in the semiconductor substrate 120 according to known techniques. An overlying dielectric layer 122 is formed using conventional process steps, and an upper surface 122A is planarized by a chemical-mechanical polishing step. Alternating conductive interconnect structures and intermetallic dielectric layers (not shown in FIG. 19) are subsequently formed overlying the dielectric layer 122 to interconnect the doped regions in the semiconductor substrate 120.

Figure 20:
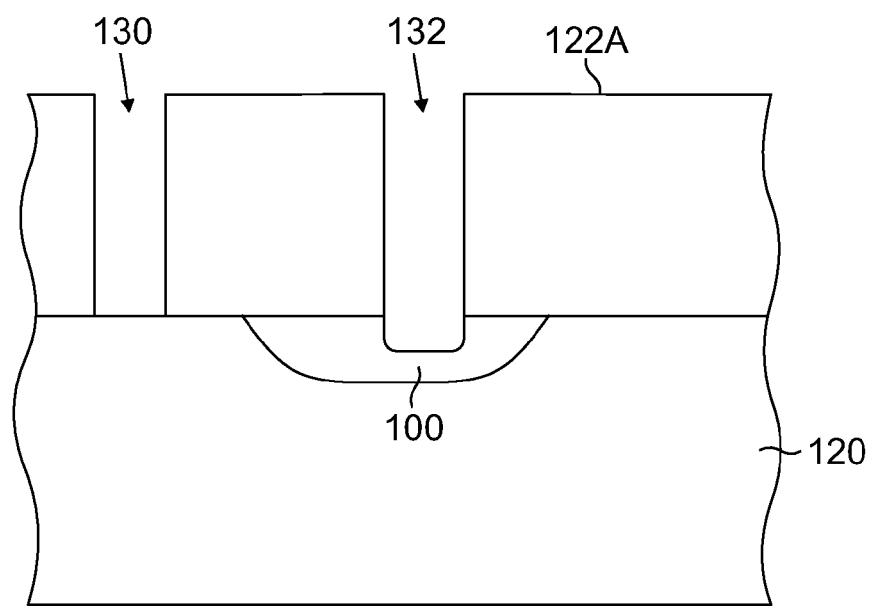
Figure 21:
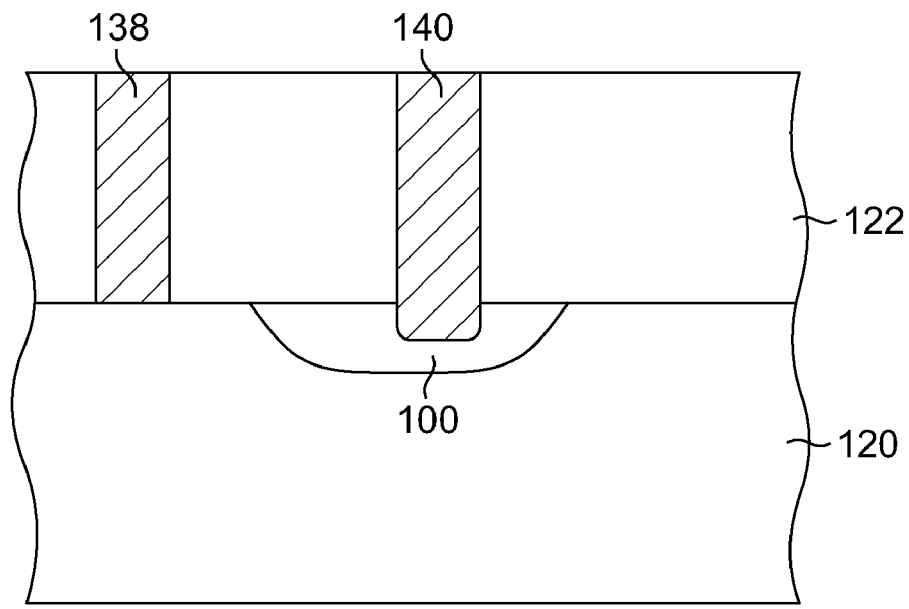

Using a mask (not shown) the dielectric layer 122 is patterned and etched to form windows 130 and 132 therein as illustrated in FIG. 20. The window 130 is conventional and used for making electrical contact to a doped region (not shown) in the semiconductor substrate 120. The window 132 extends into the shallow trench structure but does not make electrical contact with the semiconductor substrate 120. Conductive material is deposited within the windows 130 and 132 to form an electrical contact 138 and a thermal contact 140 as illustrated in FIG. 21.

Figure 22:
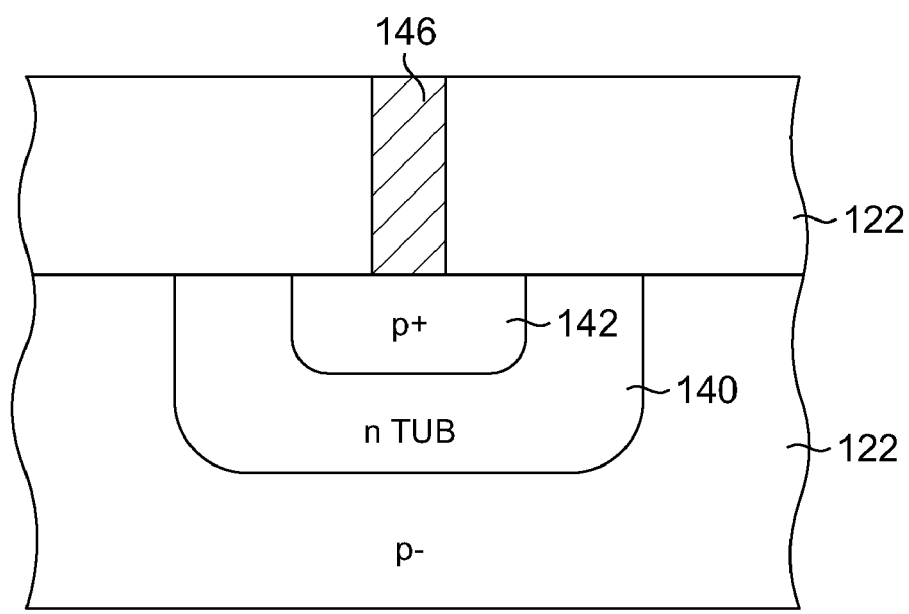

Back-to-back pn junctions can also be used to form an electrically insulated thermally conductive contact. FIG. 22 illustrates the semiconductor substrate 120 (doped p-) in which have been formed, by conventional processes, an n-tub 140 and a p++ region 142 within the n-tub 140. A contact 146 formed in the dielectric layer 122 contacts the p+ region 142, but does not make electrical contact to the semiconductor substrate 120 due to the back-to-back pn junctions, which present an open circuit to the substrate 120.

Figure 23:
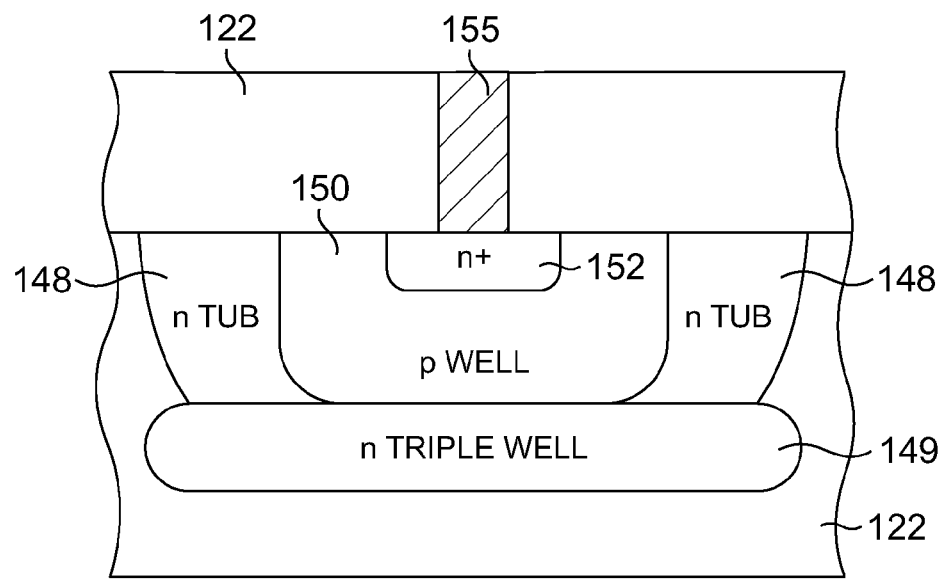

An alternative back-to-back pn junction structure is illustrated in FIG. 23 comprising n-tubs 12 and an n-type triple well 149 that surround a p well 14. An n+ region 152 formed in the p well 14 is in contact with an electrically insulated thermally conductive contact 155 formed in the dielectric layer 122.

Figure 24:
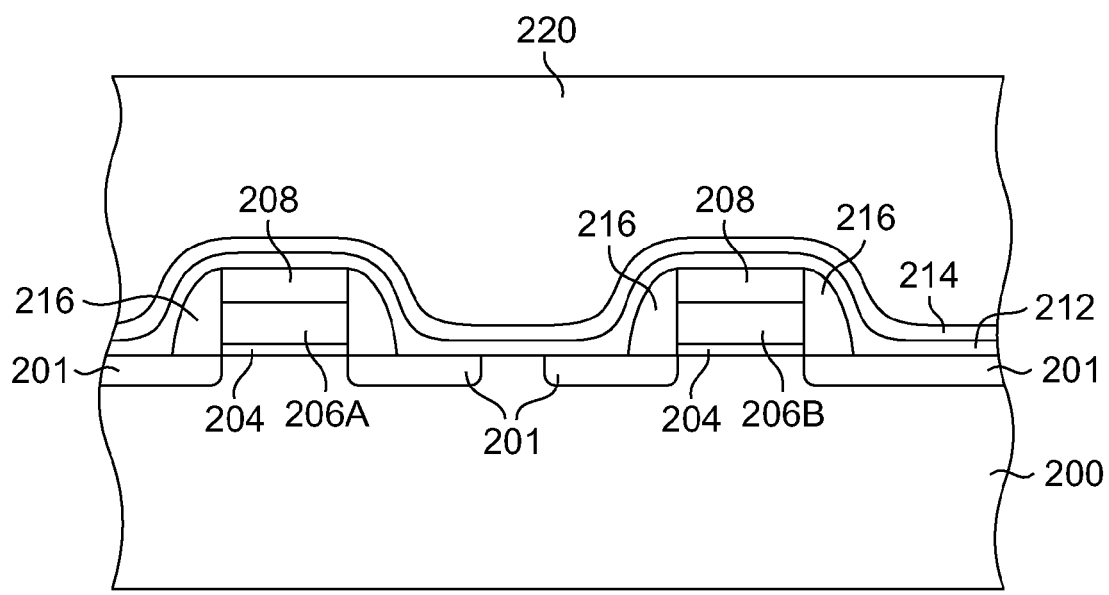
FIGS. 24-28 illustrate process flow steps for forming a thermally conductive structure according to another embodiment of the present invention.

Another process for creating a thermally conductive electrically insulated contact the thermally conductive bars 38 or structures 80 is illustrated beginning in FIG. 24. This process is employed in the fabrication of certain SRAM integrated circuits comprising MOSFETS formed over a semiconductor substrate 200. To this point in the SRAM process, source/drain regions 201 have been formed in the semiconductor substrate 200, and layered stacks comprising a gate oxide 204, gates 206A and 206B and a hard mask 208 has been formed overlying the substrate 200. A silicon dioxide layer 212 and a silicon nitride layer 214 overlie the layered stacks, and spacers 216 are disposed laterally adjacent the layered stacks. A dielectric layer 220 is formed over the substrate 200. During a subsequent metallization process, interconnect structures are formed over the dielectric layer 200 for connecting doped regions of the SRAM integrated circuit.

Figure 25:
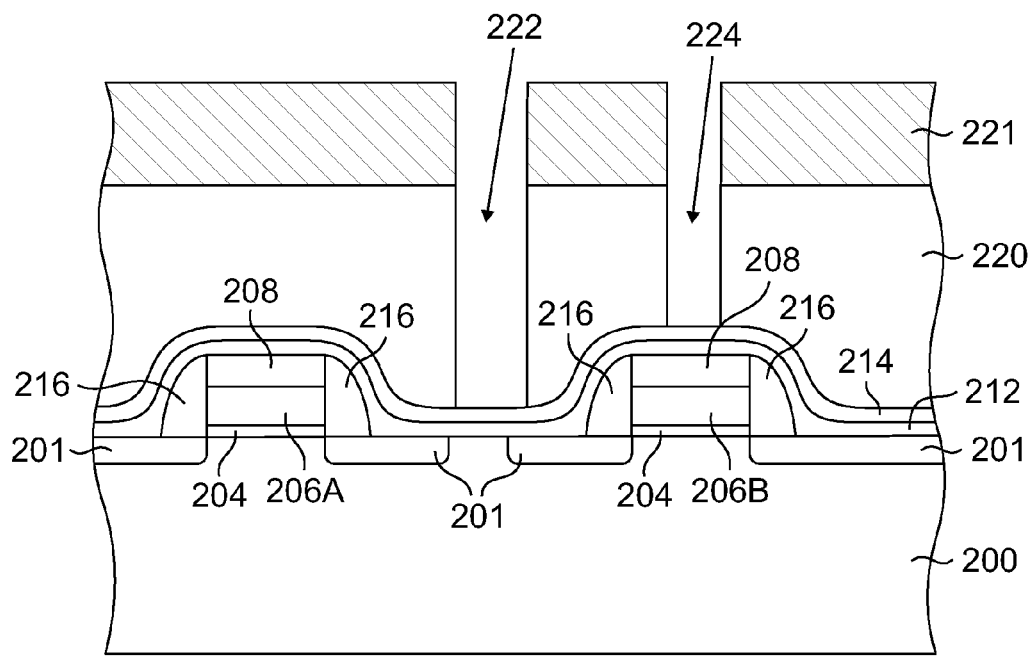
Figure 26:
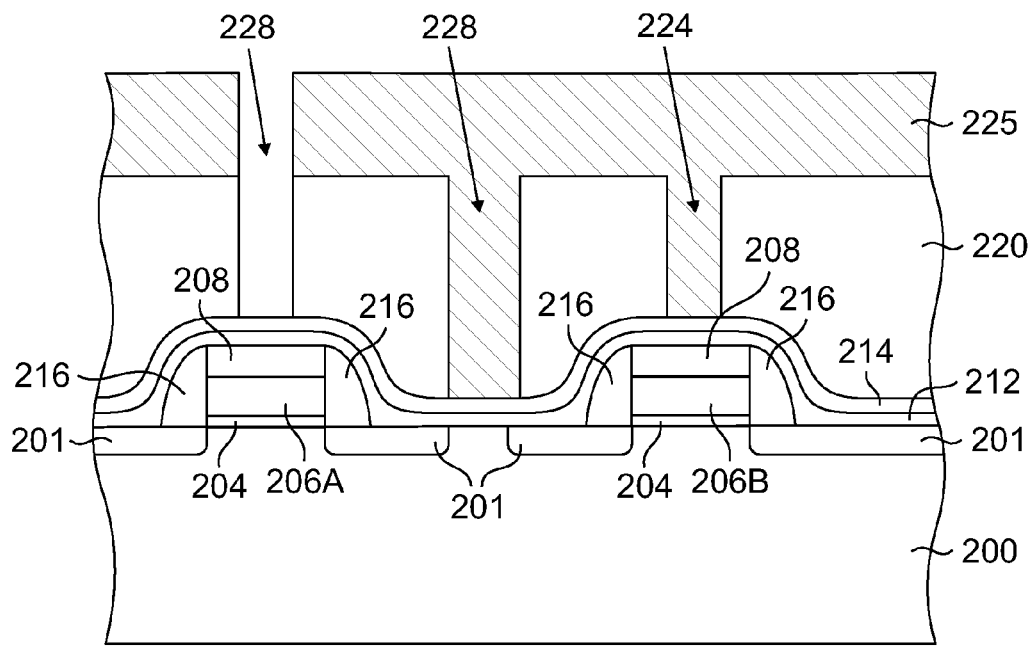

Using an appropriately patterned mask 221, windows 222 and 224 are formed in the dielectric layer 220 by etching the dielectric layer 220 to the silicon nitride layer 214. See FIG. 25. Using a mask 225, a gate window 228 is formed during several etching steps using different etchants and etch durations, including etching to the silicon nitride layer 214, etching through the silicon nitride 214 and etching through the hard mask 208, to form a window through which electrical contact can be made to the gate 206A. The resulting structure is illustrated in FIG. 26.

Figure 27:
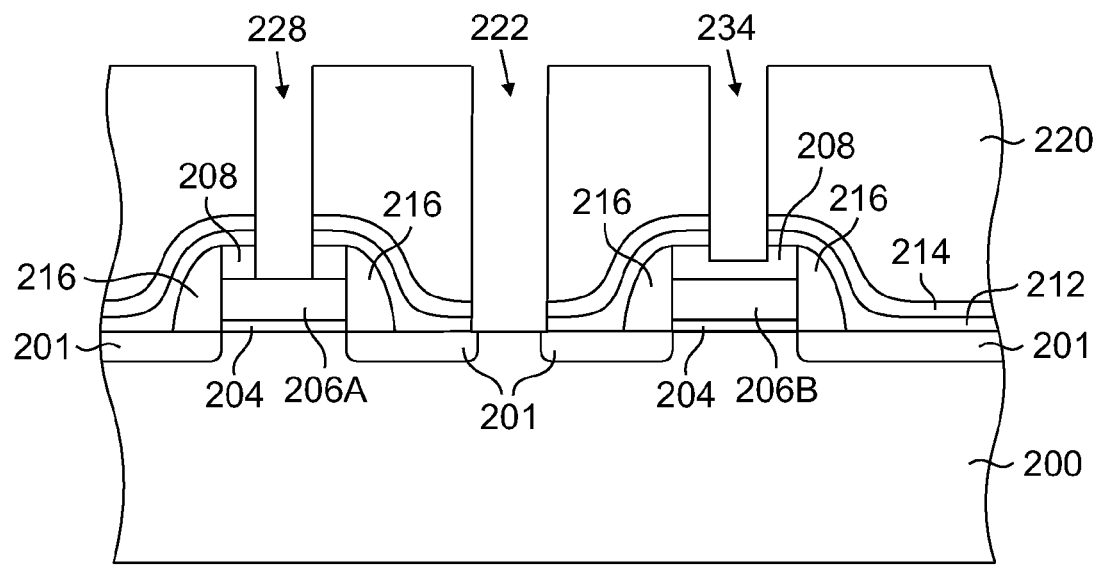

Another etching process removes the silicon nitride layer 214 and the silicon dioxide 212 through the windows 222 and 224. See FIG. 27. The duration of this etch process is controlled and/or the etchants selected to remove the silicon dioxide layer 212 and the silicon nitride layer 214, but not the gate 206A and the hard mask 208. Thus the window 222 extends to the source/drain regions 201 such that electrical contact can be provided to the source/drain region 201. The window 224 stops within the hard mask 208 such that a thermal path, but not an electrical path, is available to the substrate 200.

Figure 28:
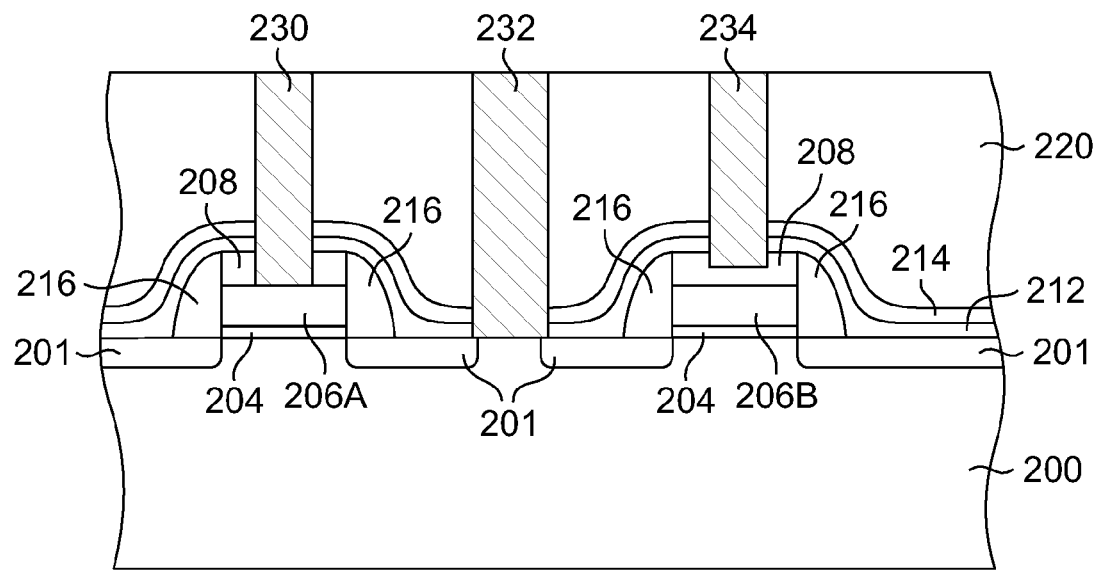

As illustrated in FIG. 28, the windows 222, 224 and 228 are filled with a conductive material (e.g., aluminum, tungsten), forming an electrical contact 230 to the gate 206A and an electrical contact 232 to the source/drain regions 201. A thermal contact 234 is formed in the window 224 for providing a thermal conduction path to the semiconductor substrate 200 via the hard mask 208, the gate 206B and the gate oxide 204.

Figure 29:
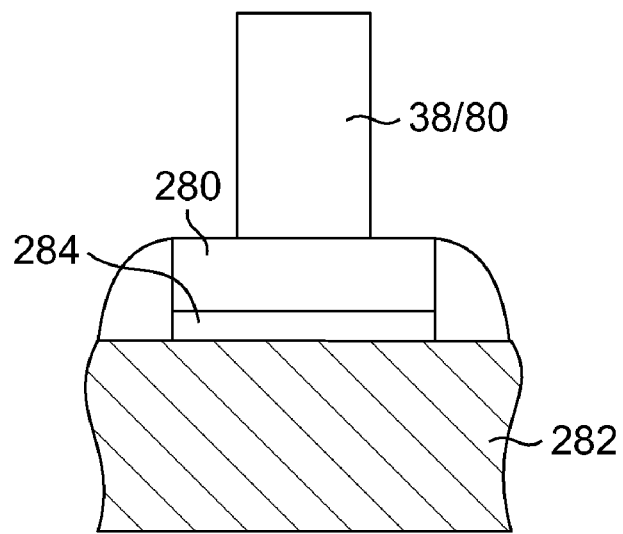
FIG. 29 illustrates a thermally conductive structure of the present invention in thermal contact with a MOSFET gate.

Certain elements of the structure and process described above in conjunction with FIGS. 24-28 for creating an electrically insulated but thermally conductive contact for an SRAM device can be applied to formation of such a contact for any MOSFET. In such an embodiment, the thermally conductive electrically incomplete structure (such as the thermally conductive bars 38 or structures 80) contacts a polysilicon gate 280, which is electrically isolated from a semiconductor substrate 282 by a gate oxide 284. See FIG. 29. Thus no current passes through the thermally conductive electrically incomplete structure due to the electrical isolation provided by the gate oxide 284, but a thermal path to ground is provided through the gate 280 and the gate oxide 284.

The relatively high and variable capacitance created between the structures 38/80 and the semiconductor substrate 282 can be avoided by forming the gate 280 in an undoped state by one of: (1) avoiding doping the gate material, for example, by omitting the n-gate and p-gate implant steps in process technologies with separate gate implants, (2) omitting the n+ and p+ source/drain implants into a gate polysilicon layer from which the gate 280 is formed, or (3) blocking salicide formation on the gate 280 to increase the resistance in the electrical path.

In a related embodiment the potential problem of gate oxide breakdown can be alleviated by using the I/O oxide layer formed on the semiconductor substrate according to conventional fabrication processes, as the gate oxide 284. The I/O oxide is thicker than the high-performance oxide layer and thus less susceptible to breakdown.

Figure 30:
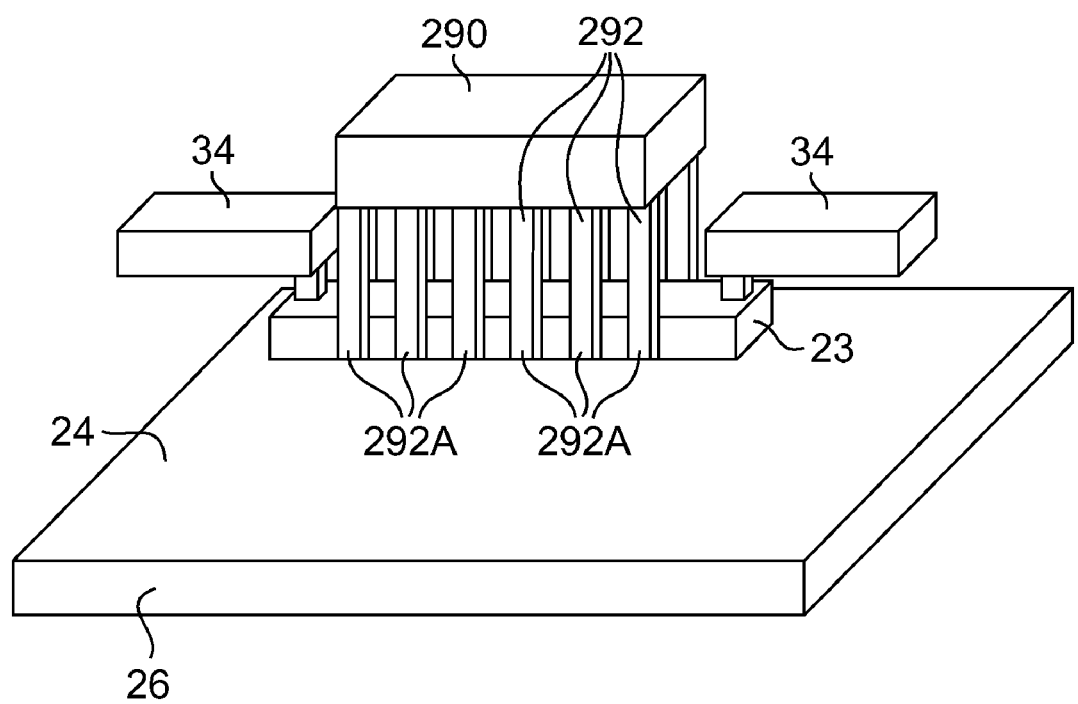
FIG. 30 is a perspective illustration of another embodiment of a thermally conductive structure according to the teachings of the present invention.

In yet another embodiment of FIG. 30, heat can be drawn up to a top heat sink 290 of the chip by thermally conductive structures 292 having lower ends 292A disposed proximate the resistor 23.

In another embodiment, the top heat sink 290 comprises a bond pad of the integrated circuit. In an embodiment where the thermally conductive structures 292 are not electrically connected to the resistor 23, the bond pad can serve as both an electrical and a thermal conductor for the integrated circuit. In an embodiment (not shown) where the thermally conductive structures 292 are electrically connected to the resistor 23, the bond pad is preferably not connected to an electrical terminal on the package, but instead is useful for dissipating heat from the integrated circuit.

Although the structures 292 are illustrated as linear elements, there is considerable flexibility in routing the structures 292 from a region of the resistor 23 to the top heat sink 290, i.e., the structures can include bends and non-linear segments. Similarly, the thermally conductive bars 38 can be implemented by non-linear structures and the thermally conductive structures 80 can be implemented using surfaces that are not planar.

As described, the present invention increases the heat flow from a power-dissipating element to the substrate, without significant design or electrical performance penalties. The structures of the invention are compatible with standard semiconductor fabrication processing, so that no additional processing costs are incurred. The thermally conductive structures are relatively small and their shapes can be configured as required. As a result there is little if any chip area penalty to be paid. There is no electrical current flow in the thermally conductive structures, so electromigration is not a concern. Although exemplary materials and fabrication processes are described herein, the selection of a specific material and the process steps for forming the thermally conductive structures are dependent on the materials of the chip and the process technologies employed to fabricate the chip.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a semiconductor integrated circuit, comprising:
   forming doped regions in a semiconductor substrate;
   forming material layers overlying the substrate;
   forming a device in one or more of the material layers;
   forming first openings in the material layers, wherein the first openings extend to the substrate and are disposed proximate the device; and
   forming thermally conductive material in the first openings.

2. The method of claim 1 further comprising forming second openings in the material layers, wherein the step of forming thermally conductive material in the first openings further comprises forming electrically conductive material in the first and the second openings.

3. The method of claim 2 further comprising forming a first and a second electrical terminal of the device, wherein the thermally conductive material is in physical contact with one of the first or the second electrical terminals, wherein the thermally conductive material does not form a current path.

4. The method of claim 1 further comprising forming electrically conductive layers overlying the material layers, wherein the electrically conductive layers are electrically insulated from the thermally conductive material.

5. The method of claim 4 wherein the thermally conductive material is in thermal communication with the electrically conductive layers.

6. The method of claim 1 wherein the openings comprise a first and a second trench disposed proximate opposing sides of the device.

7. The method of claim 1 wherein the first openings comprise a plurality of substantially vertical openings disposed proximate opposing sides of the device.

8. The method of claim 1 wherein the step of forming the device further comprises forming a resistor.

9. The method of claim 1 wherein the step of forming the first openings comprises etching the openings.

10. The method of claim 1 further comprising forming a thermally conductive top element overlying the device and in thermal communication with the thermally conductive material.

11. The method of claim 10 further comprising forming a thermally conductive element extending between the device and the thermally conductive top element.

12. A method for forming a semiconductor integrated circuit, comprising:
    forming doped regions in a semiconductor substrate;
    forming a dielectric material region in the substrate;
    forming material layers overlying the substrate;
    forming a device in one or more of the material layers overlying the dielectric region, wherein the device comprises a first and a second electrical terminal;
    forming a current conducting structure in electrical communication with one of the first and the second electrical terminals; and
    forming thermally conductive structure proximate the device, wherein the thermally conductive structure comprises a first end in physical contact with the current conducting structure and a second end in thermal communication with the dielectric material region.

13. A method for forming a semiconductor integrated circuit, comprising:

forming doped regions in a semiconductor substrate;

forming a plurality of dielectric material layers overlying and in thermal communication with the substrate;

forming a device in one or more of the plurality of dielectric material layers;

forming openings in the material layers, wherein the openings extend to one of the plurality of dielectric material layers and are disposed proximate the device; and forming thermally conductive material in the openings.

14. The method of claim 13 wherein certain of the doped regions together with certain of the plurality of dielectric material layers comprise a MOSFET having a gate structure, and wherein the one of the plurality of dielectric layers comprises a hard mask layer overlying the gate structure.

15. The method of claim 13 wherein certain of the doped regions together with certain of the plurality of dielectric material layers comprise a MOSFET having a gate structure, and wherein the one of the plurality of dielectric layers comprises a polysilicon gate of the MOSFET.

* * * * *